(12) United States Patent
Nagai

(10) Patent No.: US 12,015,006 B2
(45) Date of Patent: Jun. 18, 2024

(54) SEMICONDUCTOR DEVICE AND METHOD OF MANUFACTURING THE SAME

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventor: Shohei Nagai, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 171 days.

(21) Appl. No.: 17/688,992

(22) Filed: Mar. 8, 2022

(65) Prior Publication Data
US 2022/0310549 A1    Sep. 29, 2022

(30) Foreign Application Priority Data
Mar. 23, 2021    (JP) .................................. 2021-048077

(51) Int. Cl.
H01L 23/00    (2006.01)
(52) U.S. Cl.
CPC .............. *H01L 24/32* (2013.01); *H01L 24/29* (2013.01); *H01L 24/83* (2013.01);
(Continued)
(58) Field of Classification Search
CPC ..... H01L 2224/15–16507; H01L 2224/73151; H01L 2224/73153; H01L 2224/73251;
(Continued)

(56) References Cited

U.S. PATENT DOCUMENTS

| 2009/0181223 A1* | 7/2009 | Buchwalter | H01L 24/11 428/212 |
| 2011/0156256 A1* | 6/2011 | Kang | H01L 24/81 438/653 |
| 2013/0221521 A1* | 8/2013 | Yang | H01L 24/81 257/737 |

FOREIGN PATENT DOCUMENTS

| JP | 2015-065301 A | 4/2015 |
| JP | 2015065301 A * | 4/2015 |

(Continued)

OTHER PUBLICATIONS

T. Sakai et al., "Solder Electromigration Failure Time as a Function of the Angle Between the c-axis of Sn Crystals and Direction of Electron Flow," ICEP-IAAC 2018 Proceedings, 2018, pp. 102-107.

*Primary Examiner* — Robert G Bachner
*Assistant Examiner* — Eric Manuel Mulero Flores
(74) *Attorney, Agent, or Firm* — Posz Law Group, PLC

(57) ABSTRACT

A semiconductor device includes a substrate, a semiconductor element and a tin-based solder layer. The semiconductor element faces the substrate in a normal direction of the substrate. The normal direction corresponds to a normal line of the substrate. The tin-based solder layer joins the semiconductor element to the substrate. The tin-based solder layer a central portion and a peripheral portion surrounding the central portion. The tin-based solder layer has a tin crystal with a C-axis at each of the central portion and the peripheral portion. The C-axis at the central portion intersects the normal line at an angle larger than 45 degrees with respect to the normal line. The C-axis at the peripheral portion either intersects the normal line at an angle smaller than or equal to 45 degrees with respect to the normal line, or is parallel to the normal line.

2 Claims, 3 Drawing Sheets

(52) U.S. Cl.
CPC ............... *H01L 2224/29111* (2013.01); *H01L 2224/32155* (2013.01); *H01L 2224/83815* (2013.01); *H01L 2924/01029* (2013.01); *H01L 2924/0105* (2013.01); *H01L 2924/014* (2013.01)

(58) Field of Classification Search
CPC ..... H01L 2224/73253; H01L 2224/83–83395; H01L 2924/0105; H01L 2224/29111; H01L 2224/80411; H01L 2224/81411; H01L 24/31; H01L 24/32; H01L 24/81; H01L 24/83; H01L 2924/13–14; H01L 2224/80801–8083; H01L 2224/83801–8383
See application file for complete search history.

(56) References Cited

FOREIGN PATENT DOCUMENTS

| | | | |
|---|---|---|---|
| JP | 2016-051844 A | | 4/2016 |
| JP | 2016051844 A | * | 4/2016 |

* cited by examiner

SEMICONDUCTOR DEVICE AND METHOD OF MANUFACTURING THE SAME

CROSS REFERENCE TO RELATED APPLICATION

This application is based on Japanese Patent Application No. 2021-048077 filed on Mar. 23, 2021, the disclosure of which is incorporated herein by reference.

TECHNICAL FIELD

The present disclosure relates to a semiconductor device and a method of manufacturing the semiconductor device.

BACKGROUND

A semiconductor device may include a semiconductor element joined to a substrate with a tin-based solder layer.

SUMMARY

The present disclosure describes a semiconductor device including a substrate, a semiconductor element and a tin-based solder layer, and further describes a method for manufacturing the semiconductor device.

BRIEF DESCRIPTION OF THE DRAWINGS

The objects, features and advantages of the present disclosure will become more apparent from the following detailed description made with reference to the accompanying drawings. In the drawings.

DETAILED DESCRIPTION

Figure 1:
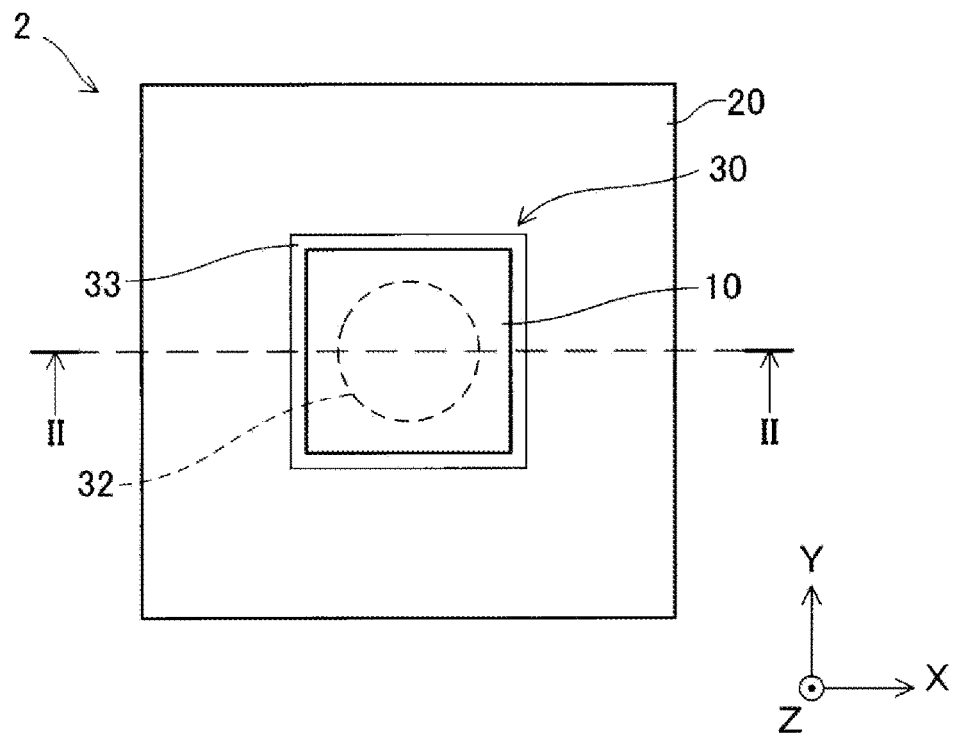
FIG. 1 is a plan view of a semiconductor device according to a first embodiment.

A semiconductor device may include a semiconductor element joined to a substrate with a tin(Sn)-based solder layer. Tin crystals included in the tin-based solder layer may have anisotropy. The tin-based solder layer may cause inelastic strain due to temperature change, and this inelastic strain has anisotropy. The inelastic strain is the largest in a C-axis direction of a tin crystal structure. When a repetitive force is applied in the direction of large inelastic strain, the deterioration of the tin-based solder layer may accelerate. Therefore, the tin-based solder layer may be formed so that the C-axis of the tin crystal contained in the tin-based solder layer is orthogonal to the maximum stress direction of the tin-based solder layer. The maximum stress acting on the solder layer between the substrate and the semiconductor element faces in the direction parallel to the substrate. In other words, the tin-based solder layer may be formed such that the C-axis of the tin crystal included in the tin-based solder layer faces in a normal direction of the substrate.

On the other hand, when current flows through the solder layer, a phenomenon called electromigration may occur. The electromigration is a phenomenon in which metal is deformed by the flow of electrons. Tin (Sn) tends to have atom transfer due to electron flow as compared with other metal such as copper (Cu). That is, the electromigration is likely to proceed in the tin-based solder layer. As the electromigration proceeds in the tin-based solder layer, the metal distribution in the tin-based solder layer may become non-uniform. That is, the tin-based solder layer may deteriorate. When the orientation of the C-axis in the tin crystal coincides with the direction of electron flow, the electromigration is likely to proceed. In a case where the substrate and the semiconductor element are jointed by the solder layer in the semiconductor device, the electrons, in other words, current mainly flow in a direction normal to the substrate. In other words, when the tin-based solder layer is formed such that the C-axis of the tin crystal included in the tin-based solder layer faces in a direction normal to the substrate, the electromigration is likely to proceed. The tin-based solder layer may be formed such that the C-axis of a tin crystal is parallel to a substrate.

In order to reduce the inelastic strain of the tin-based solder layer, the C-axis of the tin crystal may be oriented in the direction normal to the substrate, but in that case, the influence of electromigration may become larger. In order to reduce the influence of electromigration on the Sn-based solder layer, the C-axis of the Sn crystal may be orthogonal to the normal line of the substrate, but in that case, the inelastic strain may become larger.

According to a first aspect of the present disclosure, a semiconductor device includes a substrate, a semiconductor element and a tin-based solder layer. The semiconductor element faces the substrate in a direction normal to the substrate. The direction normal to the substrate is a normal direction of the substrate. The normal direction of the substrate corresponds to a normal line of the substrate. The tin-based solder layer joins the semiconductor element to the substrate. The tin-based solder layer includes a central portion and a peripheral portion. The peripheral portion surrounds the central portion in a view of the normal direction. The tin-based solder layer has a tin crystal with a C-axis, and the C-axis is at each of the central portion and the peripheral portion. The C-axis at the central portion intersects the normal line at an angle larger than 45 degrees with respect to the normal line. The C-axis at the peripheral portion either intersects the normal line at an angle smaller than or equal to 45 degrees with respect to the normal line, or is parallel to the normal line.

In the semiconductor device described above, at the central portion of the tin-based solder layer, the C-axis intersects the normal line of the substrate at an angle larger than 45 degrees with respect to the normal line of the substrate. If the C-axis intersects the normal line of the substrate at an angle larger than 45 degrees with respect to the normal line of the substrate, it is possible that the tin-based solder layer suppresses the influence of electromigration even though inelastic strain does not decrease. Since the C-axis intersects the normal line of the substrate at an angle less than or equal to 45 degrees with respect to the normal line or the C-axis is parallel to the normal line at the peripheral portion, the inelastic strain of the tin-based solder layer becomes smaller even though the effect of suppressing the influence of the electromigration is relatively small. However, the peripheral portion has a smaller current than the central portion. Because of a smaller current, the influence of the electromigration at the peripheral portion is relatively small as considering the semiconductor device as a whole. On the other hand, by suppressing the inelastic strain at the peripheral portion, the strain at the central portion surrounded by the peripheral portion is also suppressed. The semiconductor device described in the present description has a higher resistance to both of the inelastic strain and the electromigration.

At the central portion, the C-axis is orthogonal to the normal line of the substrate. In the tin-based layer, the central portion has a larger current than the peripheral portion. Therefore, if the C-axis is orthogonal to the normal line of the substrate at the central portion, it is possible to obtain higher resistance to the electromigration. On the contrary, since a large amount of current does not flow in the peripheral portion, the influence of electromigration is relatively small.

According to a second aspect of the present disclosure, a method manufactures a semiconductor device including a substrate, a semiconductor element and a tin-based solder layer. The semiconductor element faces the substrate in a direction normal to the substrate. the direction normal to the substrate is a normal direction of the substrate. The tin-based solder layer joins the semiconductor element to the substrate. The method includes: a first process that heats and melts tin-based solder material disposed between the semiconductor element and the substrate; and a second process that cools the melted tin-based solder material, and solidifies the tin-based solder material. In the second process, a heat transfer plate is sandwiched between the substrate and a cooler. The heat transfer plate includes: a first region that faces a central portion of the tin-based solder layer in a view of the normal direction; and a second region that faces a peripheral portion of the tin-based solder layer in the view of the normal direction. The peripheral portion surrounds the central portion in the view of the normal direction. The first region has a higher rate of heat flow than the second region.

When the heat transfer plate is adopted, the heat flows in the normal direction of the substrate at the central portion of the tin-based layer. At the peripheral portion, the heat flows in a direction tilted to the normal direction. The melted tin-based solder layer is crystallized such that the C-axis is perpendicular to the direction of the heat flow. Therefore, by adopting the heat transfer plate described above, it is possible to form the tin-based solder layer such that the C-axis is orthogonal to the normal line of the substrate at the central portion, and such that the C-axis is tilted to the normal line of the substrate at the peripheral portion.

First Embodiment

Figure 2:
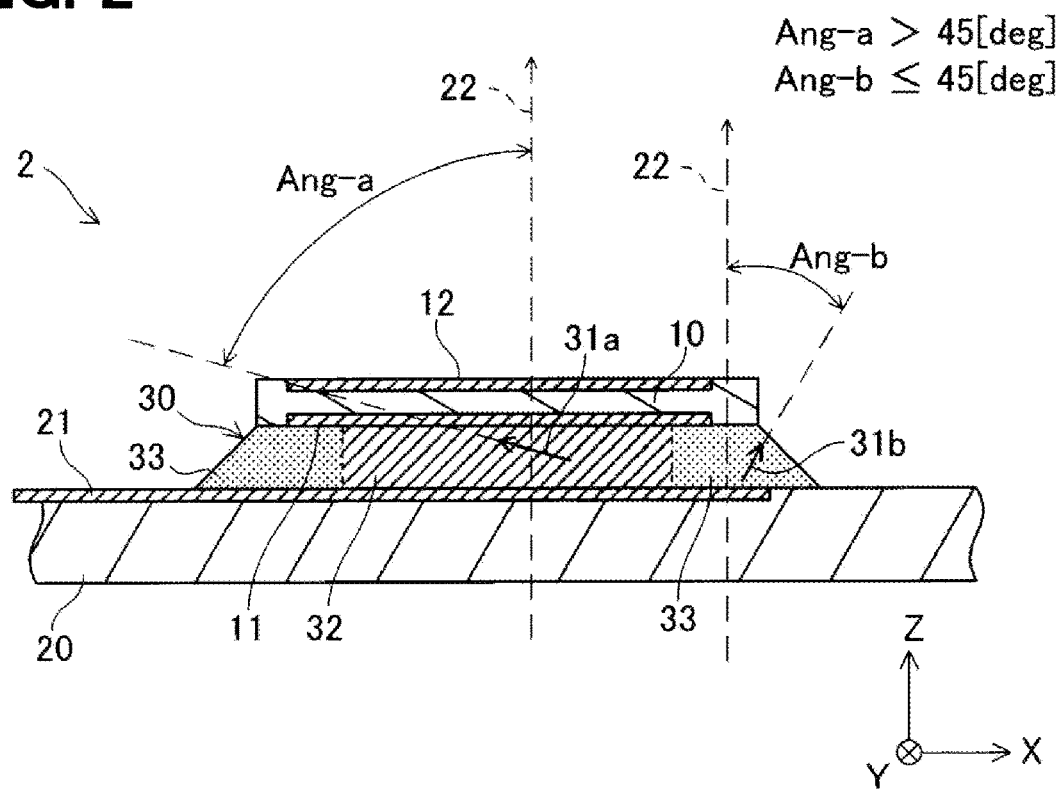
FIG. 2 is a cross-sectional view of the semiconductor device taken along line II-II shown in FIG. 1.

The following describes a semiconductor device 2 according to a first embodiment with reference to FIGS. 1, 2. FIG. 1 illustrates a plan view of the semiconductor device 2. FIG. 2 illustrates a plan view of the semiconductor device 2. FIG. 2 illustrates a cross section of the semiconductor device 2 along II-II line taken in FIG. 1. The semiconductor device 2 is a device in which a semiconductor element 10 is joined above a substrate 20.

In a coordinate system in each of FIGS. 1, 2, a Z-axis corresponds to a direction normal to the substrate 20. The direction normal to the substrate 20 may also be referred to as a normal direction of the substrate 20. The normal direction of the substrate 20 corresponds to a normal line 22 of the substrate 20 described in the following. The semiconductor element 10 faces the substrate 20 in the normal direction of the substrate 20.

The solder layer 30 joins the semiconductor element 10 to the substrate 20. In the following, a central portion of the solder layer 30 as viewed in the normal direction, in other words, a Z-direction of the substrate 20 may also be referred to as a central portion 32, and a region surrounding the central portion 32 may also be referred to as a peripheral portion 33 as viewed in the normal direction.

The semiconductor element 10 is a power transistor, and has a surface where a collector electrode 11 is disposed and another surface where an emitter electrode 12 is disposed. FIG. 2 omits the illustration of the structure of the semiconductor element other than the collector electrode 11 and the emitter electrode 12. A wiring pattern 21 is formed at the substrate 20. The wiring pattern 21 refers to a conductive path formed at a surface of the substrate 20.

The wiring pattern 21 of the substrate and a collector electrode 11 as one of the electrodes of the semiconductor 10 face each other. The solder layer 30 is in contact with the wiring pattern 21 and the collector electrode 11. A circuit (not shown) is mounted on the substrate 20, and the solder layer 30 and the wiring pattern 21 electrically connect the collector electrode 11 of the semiconductor element 10 to the circuit. The member that electrically connects the emitter electrode 12 to the circuit is not shown.

The solder layer 30 contains tin (Sn). Solder containing tin may also be referred to as a tin-based solder layer. The solder layer 30 is the tin-based solder layer. As an example of the tin-based solder material, a Sn-3Ag-0.5Cu alloy may be adopted. Tin is crystallized in the solder layer 30. The orientation of the C-axis 31 of the tin crystal is different in the central portion 32 of the solder layer 30 and in the peripheral portion 33 of the solder layer 30. The C-axis 31a at the central portion 32 and the C-axis 31b at the peripheral portion 33 may be described as the C-axis 31 in a case where there is no need to distinguish both of the C-axis 31a and the C-axis 31b.

The C-axis 31a at the central portion 32 intersects the normal line 22 of the substrate 20 at an angle larger than 45 degrees with respect to the normal line 22. The C-axis 31b at the peripheral portion 33 intersects the normal 22 at an angle of 45 degrees or smaller with respect to the normal line 22. Alternatively, the C-axis 31b at the peripheral portion 33 is parallel to the normal line 22.

Figure 3:
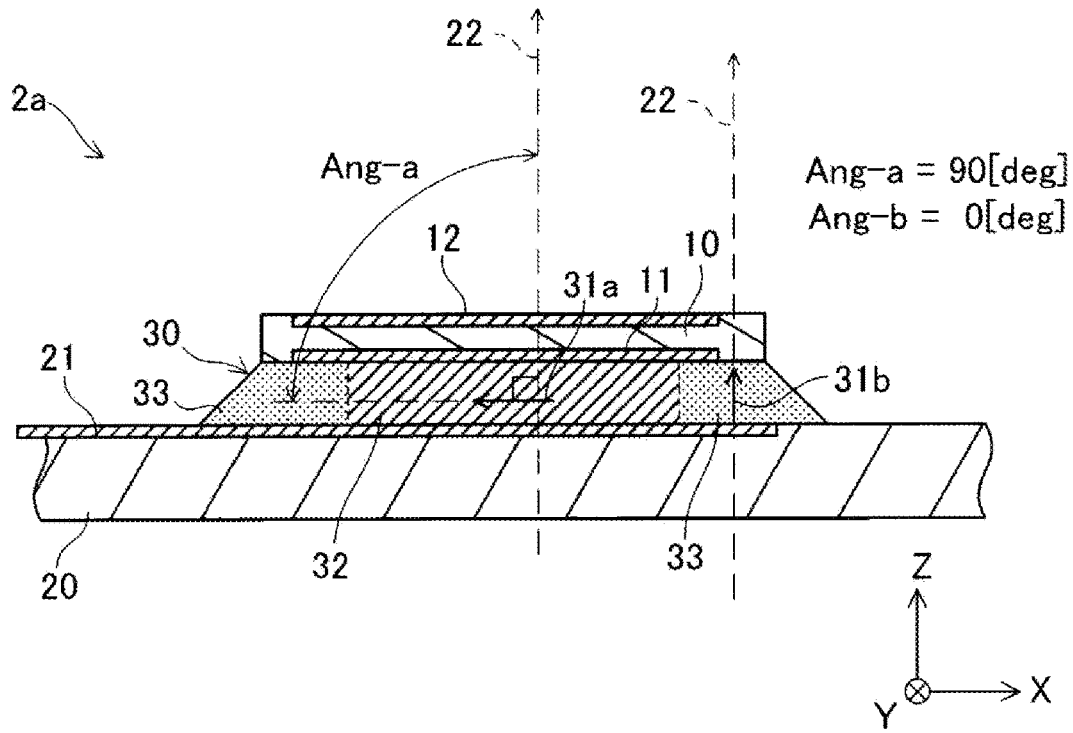
FIG. 3 is a cross-sectional view of a semiconductor device according to a second embodiment.
Figure 4:
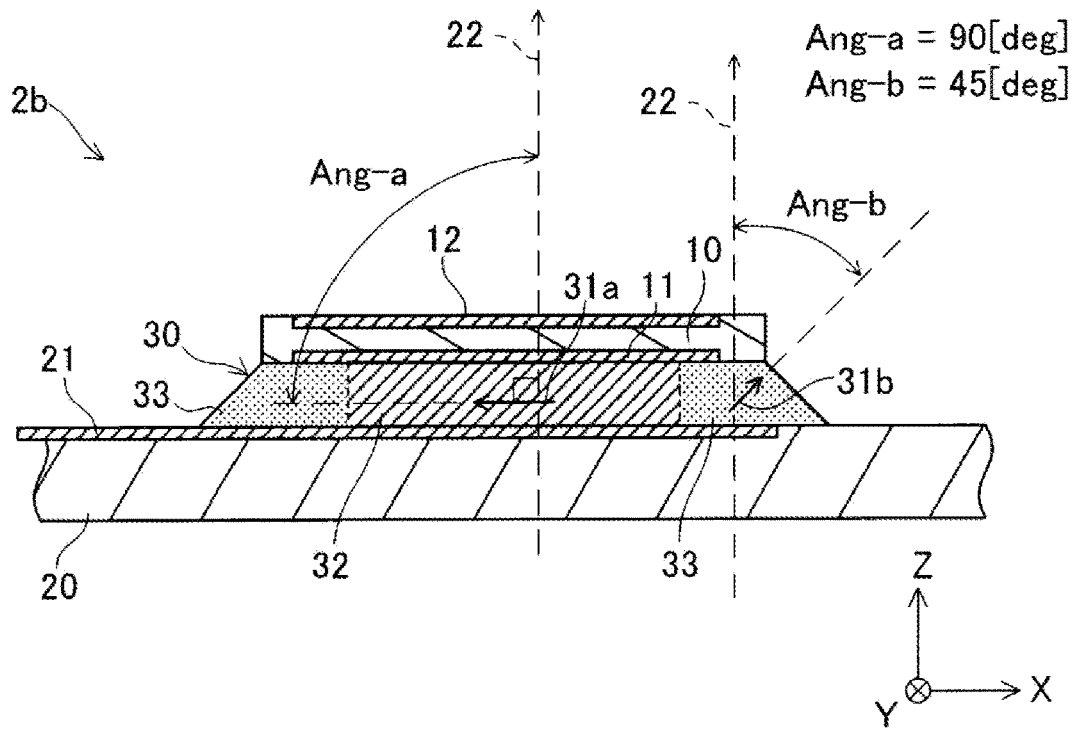
FIG. 4 is a cross-sectional view of a semiconductor device according to a third embodiment.

In FIGS. 2, 3, 4, the angle Ang-a represents an angle formed by the C-axis 31a at the central portion 32 and the normal line 22, and the angle Ang-b represents an angle Ang-b formed by the C-axis 31b at the peripheral portion 33 and the normal line 22. The angle formed by the C-axis 31 and the normal line 22 refers to an acute angle formed by two lines. The following may also express the angle at an obtuse angle side. For instance, the angle Ang-a formed by the C-axis 31a at the central portion 32 and the normal line 22 may be larger than 45 degrees and smaller than 135 degrees, and the angle Ang-b formed by the C-axis 31b at the peripheral portion 33 and the normal line 22 may be smaller than or equal to 45 degrees or may be larger than or equal to 135 degrees.

The following describes the advantages of different orientations of the C-axis 31 respectively at the central portion 32 and the peripheral portion 33. In the tin-based solder layer, when the orientation of the C-axis of the tin crystal inside the solder matches the direction of current flow, the electromigration proceeds, in other words, the solder deteriorates. When the orientation of the C-axis is orthogonal to the direction of current flow, the progress of electromigration is the slowest. In the tin-based solder, the inelastic strain in the direction of the C-axis becomes larger than the inelastic strain in other directions. Therefore, when the orientation of the C-axis matches the orientation of the maximum stress acting on the solder, the inelastic strain generated in the solder becomes larger. In other words, the deterioration caused by the stress progresses. On the contrary, when the orientation of the C-axis is orthogonal to the orientation of the maximum stress, the inelastic strain becomes the smallest. In other words, the progress of the deterioration caused by the stress becomes the slowest.

In the solder layer 30 sandwiched between the substrate 20 and the semiconductor element 10, the current flow is oriented to the direction of the normal line 22 of the substrate 20, and the direction of the maximum stress is orthogonal to the normal line 22. When the C-axis 31 intersects the normal line 22 at an angle larger than 45 degrees with respect to the normal line 22, the effect of suppressing the electromigration is larger than the effect of suppressing the inelastic strain. When the C-axis intersects the normal line 22 at an angle smaller than or equal to 45 degrees with respect to the normal line 22, the effect of suppressing the inelastic strain is greater than the effect of suppressing the electromigration.

Therefore, in the central portion 32 having the flow of a larger current flow than the peripheral portion 33, the solder layer 30 is arranged such that the C-axis 31a intersects the normal line 22 at an angle larger than 45 degrees with respect to the normal line 22. The remarkable effect of suppressing the electromigration is attained in the central portion 32 having the flow of a larger current. In the peripheral portion 33 surrounding the central portion 32, the solder layer 30 is arranged such that the C-axis 31b intersects the normal line 22 at an angle smaller than or equal to 45 degrees with respect to the normal line 22. In the peripheral portion 33, the remarkable effect of suppressing the inelastic strain is attained. If the inelastic strain can be suppressed in the peripheral portion 33, it is also possible to suppress the inelastic strain in the central portion 32 surrounded by the peripheral portion 33. In the central portion 32, even though the effect of suppressing the inelastic strain caused by the orientation of the C-axis is smaller, the effect of suppressing the inelastic strain exerted by the peripheral portion 33 can be attained. The solder layer 30 of the semiconductor device 2 has a higher resistance to both of the inelastic strain and the electromigration.

Second Embodiment

FIG. 3 illustrates a cross-sectional view of a semiconductor device 2a according to a second embodiment. In the semiconductor device 2a, the C-axis 31a at the central portion 32 of the solder layer 30 is orthogonal to the normal line 22 (Ang-a=90 degrees). The C-axis 31b at the peripheral portion 33 surrounding the central portion 32 is parallel to the normal line 22 (Ang-b=0 degrees). When the orientation of the C-axis 31 is set as described above, the maximum effect of suppressing the electromigration is attained in the central portion 32, and the maximum effect of suppressing the deterioration caused by the inelastic strain is attained in the peripheral portion 33.

Third Embodiment

FIG. 4 illustrates a cross-sectional view of a semiconductor device 2b according to a third embodiment. In the semiconductor device 2b, the C-axis 31a at the central portion 32 of the solder layer 30 is orthogonal to the normal line 22 (Ang-a=90 degrees). The C-axis 31b at the peripheral portion 33 surrounding the central portion 32 is tilted to the normal line 22 at an angle of 45 degrees (Ang-b=0 degrees) with respect to the normal line 22. When the orientation of the C-axis is set as described above, the maximum effect of suppressing the electromigration is attained in the central portion 32, and both of the maximum effect of suppressing the deterioration caused by the inelastic strain and the maximum effect of suppressing the electromigration are attained in the peripheral portion 33.

Fourth Embodiment

Figure 5:
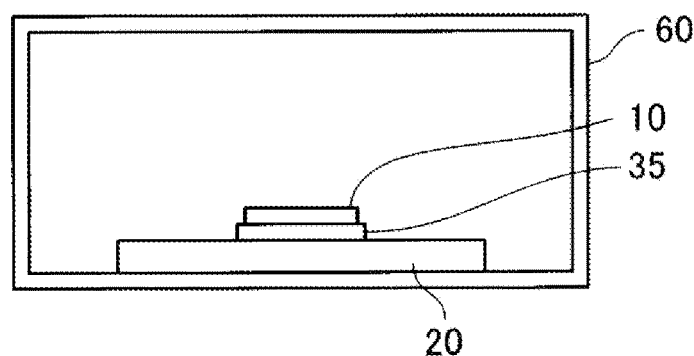
FIG. 5 is a diagram showing a manufacturing process of the semiconductor device in a fourth embodiment.

The following describes a method for manufacturing the semiconductor device 2 described in the first embodiment. The manufacturing method includes a first process and a second process. In the first process, the tin-based solder material arranged between the substrate and the semiconductor element is heated and melted. As illustrated in FIG. 5, for example, the substrate 20, the semiconductor element 10 and tin-based material 35 are placed in a high-temperature furnace 60 and heated. The tin-based material 35 is sandwiched between the substrate 20 and the semiconductor element 10. In the second process, the melted solder material is cooled and solidified. A joining method in which a solid or paste-like solder material is placed in a desired location and then the solder material is melted is also referred to as a reflow soldering process.

Figure 6:
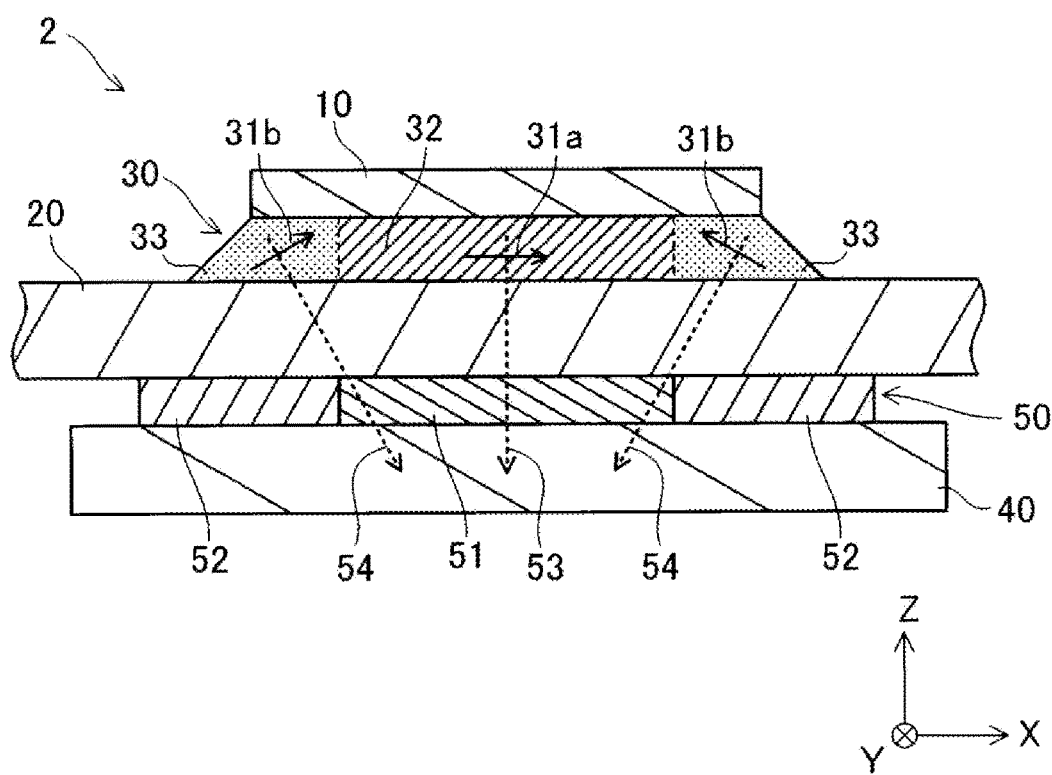
FIG. 6 is a diagram showing another manufacturing process of the semiconductor device in the fourth embodiment.

FIG. 6 illustrates the second process. FIG. 6 omits the illustration of the wiring pattern 21 and electrodes 11, 12. A cooler 40 is attached to the substrate to solidify the melted tin-based solder material 35. A heat transfer plate 50 is sandwiched between the substrate 20 and the cooler 40. The heat transfer plate 50 has a first region 51 and a second region 52. The first region 51 faces the central portion 32 of the semiconductor element 10 as viewed in the normal direction, in other words, Z-direction of the substrate 20. The second region 52 faces the peripheral region 33 surrounding the central portion 32. The thermal conductivity at the first region 51 is higher than the thermal conductivity at the second region 52. The thermal conductivity may also be referred to as a rate of heat flow.

The heat of the melted tin-based material 35 is transferred to the cooler 40 through the heat transfer plate 50. Since the central portion 32 faces the first region 51 with higher thermal conductivity, the heat of the central portion 32 is transferred in a direction parallel to the normal line 22 of the substrate 20, in other words, the Z-axis in the coordinate system in the drawing. A dotted arrow line 53 represents a direction of the heat transfer at the central portion 32 of the solder layer 30.

The peripheral portion 33 faces the second region 52 with lower thermal conductivity. The heat of the peripheral portion 33 does not flow in a direction parallel to the normal line, but flows in a tilted direction so as to approach the first region 51 having higher thermal conductivity. A dotted arrow line 54 represents a direction of the heat transfer at the peripheral portion 33. In a case where tin is solidified, the tin is crystallized such that the C-axis is orthogonal to the heat flow. Therefore, the C-axis 31a is perpendicular to the normal line 22, in other words, the Z-axis at the central portion 32, and the C-axis 31b is tilted to the normal line 22, in other words, the Z-axis at the peripheral portion 33. By appropriately determining the position of a boundary between the first region 51 and the second region 52 of the heat transfer plate 50, it is possible to set an angle of 45 degrees or smaller between the C-axis 31b at the peripheral portion 33 and the normal line 22, in other words, the Z-axis. Thus, the semiconductor device 2 described in the first embodiment is obtained.

Since the thermal conductivity of the second region 52 is lower than the thermal conductivity of the first region 51, the second region 52 may be a gap or a void.

The points to be noted regarding the technique of the above embodiments are described in the following. The semiconductor element 10 is not merely limited to a transistor.

The boundary between the central portion 32 and the peripheral portion 33 of the solder layer 30 may not have to be clearly set. In other words, in a boundary region between the central portion 32 and the peripheral portion 33, the orientation of the C-axis 31 may gradually change. The C-axis 31a may intersect at an angle greater than 45 degrees with respect to the normal line 22 at most of the region of the central portion 32, and the C-axis 31b may intersect at an angle less than or equal to 45 degrees with respect to the normal line 22. Alternatively, the C-axis 31b may be parallel to the normal line at most of the region of the peripheral portion 33.

Although specific examples of the present disclosure have been described in detail above, these are merely examples and do not limit the scope of the present description. The techniques described in the present description include various modifications and modifications of the specific examples illustrated above. In addition, the technical elements described in the present description or the drawings exhibit technical usefulness alone or in various combinations, and are not limited to the combinations described in the present description at the time of filing. In addition, the techniques illustrated in the present specification or drawings can achieve multiple purposes at the same time, and achieving one of the purposes itself has technical usefulness.

What is claimed is:

1. A semiconductor device comprising:
a substrate;
a semiconductor element configured to face the substrate in a direction normal to the substrate, the direction being a normal direction of the substrate and corresponding to a normal line of the substrate; and
a tin-based solder layer configured to join the semiconductor element to the substrate,
wherein the tin-based solder layer includes a central portion and a peripheral portion surrounding the central portion in a view of the normal direction,
wherein the tin-based solder layer has a tin crystal with a C-axis, and the C-axis is at each of the central portion and the peripheral portion,
wherein the C-axis at the central portion intersects the normal line at an angle larger than 45 degrees with respect to the normal line, and
wherein the C-axis at the peripheral portion either intersects the normal line at an angle smaller than or equal to 45 degrees with respect to the normal line, or is parallel to the normal line.

2. The semiconductor device according to claim 1, wherein the C-axis is orthogonal to the normal line at the central portion.

* * * * *